United States Patent
Zhang

(10) Patent No.: US 10,079,239 B2
(45) Date of Patent: Sep. 18, 2018

(54) COMPACT THREE-DIMENSIONAL MASK-PROGRAMMED READ-ONLY MEMORY

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 15/455,178

(22) Filed: Mar. 10, 2017

(65) Prior Publication Data

US 2017/0186811 A1    Jun. 29, 2017

Related U.S. Application Data

(63) Continuation-in-part of application No. 14/636,346, filed on Mar. 3, 2015, now Pat. No. 9,666,641.
(Continued)

(30) Foreign Application Priority Data

Feb. 27, 2017    (CN) .......................... 2017 1 0105750
Feb. 28, 2017    (CN) .......................... 2017 1 0109705

(51) Int. Cl.

| | | |
|---|---|---|
| G11C 11/00 | (2006.01) | |
| G11C 7/00 | (2006.01) | |
| H01L 27/112 | (2006.01) | |
| H01L 27/24 | (2006.01) | |
| G11C 17/04 | (2006.01) | |
| H01L 27/06 | (2006.01) | |
| H01L 45/00 | (2006.01) | |
| H01L 27/102 | (2006.01) | |
| H01L 49/02 | (2006.01) | |
| G11C 13/00 | (2006.01) | |

(52) U.S. Cl.
CPC .... *H01L 27/11206* (2013.01); *G11C 13/0023* (2013.01); *G11C 17/04* (2013.01); *H01L 27/0688* (2013.01); *H01L 27/1021* (2013.01); *H01L 27/2436* (2013.01); *H01L 27/2481* (2013.01); *H01L 28/00* (2013.01); *H01L 45/04* (2013.01); *G11C 13/0004* (2013.01); *G11C 13/0007* (2013.01); *G11C 13/0011* (2013.01); *G11C 2213/71* (2013.01); *G11C 2213/72* (2013.01)

(58) Field of Classification Search
None
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |

(Continued)

*Primary Examiner* — Charles Garber
*Assistant Examiner* — Xiaoming Liu

(57) ABSTRACT

A compact three-dimensional mask-programmed read-only memory (3D-MPROM$_C$) is disclosed. Its memory array and a decoding stage thereof are formed on a same memory level above the substrate. The memory layers of the memory devices in the memory array have at least two different thicknesses, while the middle layer of the decoding device in the decoding stage has the same thickness as the thinnest memory layer.

20 Claims, 13 Drawing Sheets

Related U.S. Application Data

(60) Provisional application No. 61/979,501, filed on Apr. 14, 2014.

(56) References Cited

U.S. PATENT DOCUMENTS

| | | | |
|---|---|---|---|
| 4,598,386 A | 7/1986 | Roesner et al. | |
| 4,603,341 A | 7/1986 | Bertin et al. | |
| 4,646,266 A | 2/1987 | Ovshinsky et al. | |
| 4,796,074 A | 1/1989 | Roesner | |
| 4,939,568 A | 7/1990 | Kato et al. | |
| 5,257,224 A | 10/1993 | Nojiri et al. | |
| 5,272,370 A * | 12/1993 | French | H01L 27/112 257/353 |
| 5,375,085 A | 12/1994 | Gnade et al. | |
| 5,455,435 A | 10/1995 | Fu et al. | |
| 5,468,983 A | 11/1995 | Hirase et al. | |
| 5,721,169 A | 2/1998 | Lee | |
| 5,751,012 A | 5/1998 | Wolstenholme et al. | |
| 5,825,686 A | 10/1998 | Schmitt-Landsiedel et al. | |
| 5,835,396 A | 11/1998 | Zhang | |
| 5,838,530 A | 11/1998 | Zhang | |
| 5,841,150 A | 11/1998 | Gonzalez et al. | |
| 5,843,824 A | 12/1998 | Chou et al. | |
| 5,847,442 A | 12/1998 | Mills, Jr. et al. | |
| 5,854,111 A | 12/1998 | Wen | |
| 5,904,526 A | 5/1999 | Wen et al. | |
| 5,907,778 A | 5/1999 | Chou et al. | |
| 5,943,255 A | 8/1999 | Kutter et al. | |
| 6,015,738 A | 1/2000 | Levy et al. | |
| 6,021,079 A | 2/2000 | Worley | |
| 6,034,882 A | 3/2000 | Johnson et al. | |
| 6,049,481 A | 4/2000 | Yamasaki | |
| 6,055,180 A | 4/2000 | Gudesen et al. | |
| 6,185,122 B1 | 2/2001 | Johnson et al. | |
| 6,221,723 B1 | 4/2001 | Kunitou | |
| 6,236,587 B1 | 5/2001 | Gudesen et al. | |
| 6,380,597 B1 | 4/2002 | Gudesen et al. | |
| 6,385,074 B1 | 5/2002 | Johnson et al. | |
| 6,515,888 B2 | 2/2003 | Johnson et al. | |
| 6,587,387 B1 | 7/2003 | Fan et al. | |
| 6,773,937 B1 | 8/2004 | Ho et al. | |
| 7,892,865 B2 | 2/2011 | Yano et al. | |
| 7,952,904 B2 | 5/2011 | Zhang | |
| 8,000,134 B2 | 8/2011 | Cornwell et al. | |
| 2010/0025861 A1* | 2/2010 | Zhang | G11C 5/02 257/777 |
| 2014/0284535 A1* | 9/2014 | Saitoh | H01L 27/2436 257/2 |

* cited by examiner

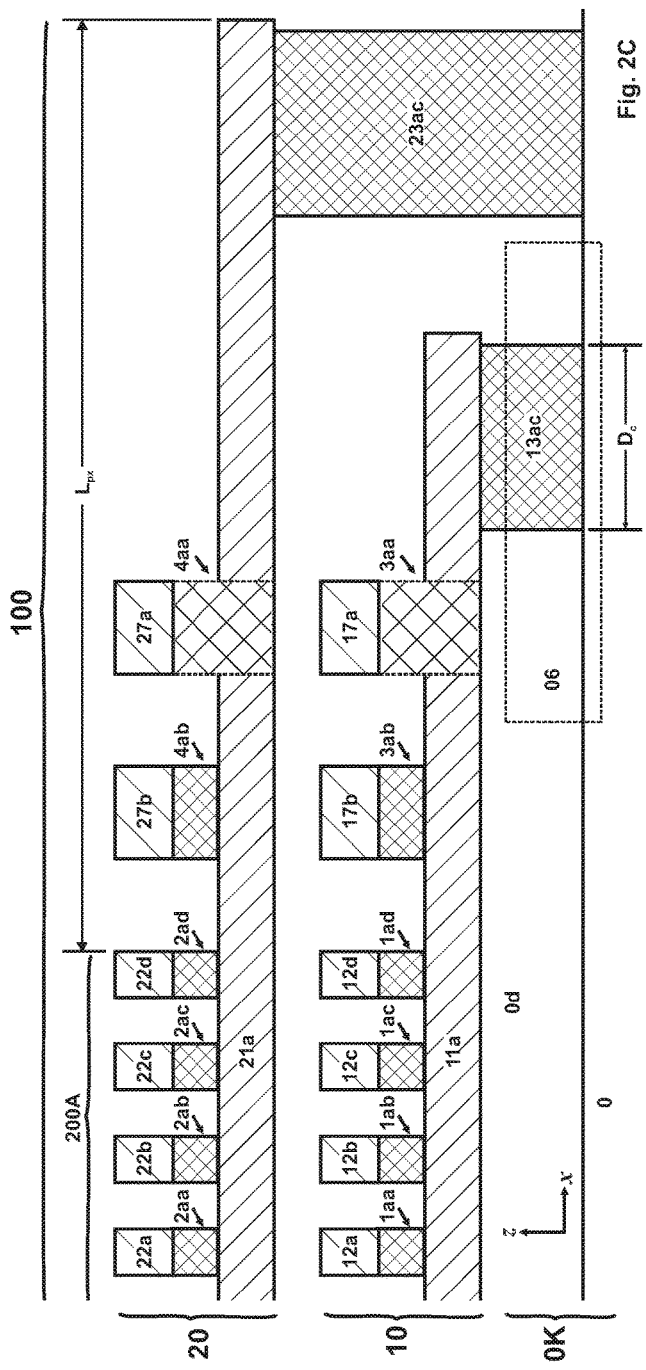
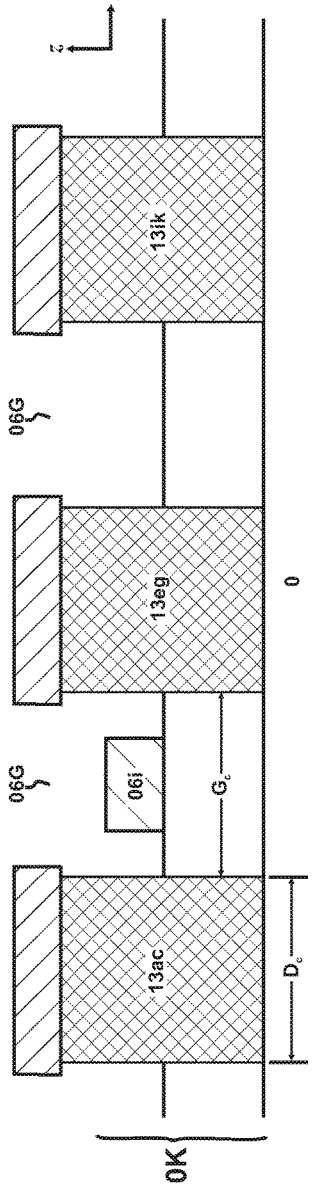

COMPACT THREE-DIMENSIONAL MASK-PROGRAMMED READ-ONLY MEMORY

CROSS-REFERENCE TO RELATED APPLICATIONS

This application is a continuation-in-part of application "Compact Three-Dimensional Memory", application Ser. No. 14/636,346, filed Mar. 3, 2015, which claims benefit of a provisional application, "Compact Three-Dimensional Memory", Application Ser. No. 61/979,501, filed Apr. 14, 2014, the disclosures of which are incorporated herein by references in their entireties.

BACKGROUND

1. Technical Field of the Invention

The present invention relates to the field of integrated circuit, and more particularly to three-dimensional memory (3D-M).

2. Prior Art

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further comprise at least one of a memristor, a resistive random-access memory (RRAM or ReRAM), a phase-change memory, a programmable metallization cell (PMC), a conductive-bridging random-access memory (CBRAM) or other memory devices.

U.S. Pat. No. 5,835,396 issued to Zhang on Nov. 3, 1998 discloses a 3D-M, more particularly a 3D-ROM (FIG. 1A). It comprises a substrate 0 and a substrate circuit 0K located thereon. An insulating dielectric 0d covers the substrate circuit 0K and is planarized. A first memory level 10 is stacked above the insulating dielectric 0d, with a second memory level 20 stacked above the first memory level 10. The first and second memory levels 10, 20 are coupled to the substrate circuit 0K through contact vias 13a, 23a, respectively. Each of the memory levels (e.g. 10, 20) comprises a plurality of upper address-lines (i.e. y-lines, e.g. 12a-12d, 22a-22d), a plurality of lower address-lines (i.e. x-lines, e.g. 11a, 21a) and a plurality of memory devices (e.g. 1aa-1ad, 2aa-2ad) at the intersections between the upper and lower address-lines.

Each memory level (e.g. 20) comprises at least a memory array (e.g. 200A). A memory array 200A is a collection of memory devices (e.g. 2aa-2ad) in a memory level 20 that share at least one address-line (e.g. 21a, 22a-22d). Within a single memory array 200A, all address-lines (e.g. 21a, 22a-22d) are continuous; between adjacent memory arrays, address-lines are not continuous. On the other hand, a 3D-M die comprises a plurality of memory blocks (e.g. 100). The structure shown in FIG. 1A is a portion of the memory block 100. The topmost memory level 20 of the memory block 100 comprises only a single memory array 200A. In other words, within the topmost memory level 20 of the memory block 100, all address-lines 21a, 22a-22d are continuous and terminate at or near the edge of the memory block 100.

Each memory device 1aa is a two-terminal device having at least two possible states. Most common memory devices comprise diodes or diode-like devices. To be more specific, the memory cell 1aa comprises a diode layer whose electrical characteristic is that of a diode and a programmable layer whose state can be altered during or after manufacturing (FIG. 1A). Alternatively, the diode layer and the programmable layer in the memory device 1aa can be merged into a single layer, as disclosed in U.S. Pat. No. 8,071,972 issued to Lu et al. The memory device 1aa is represented by a symbol combining a diode and a capacitor in FIG. 1B. Because the memory devices 1aa ... are formed at the cross-points of address-lines 12a, 11a ..., the memory array 100A is a cross-point array.

Throughout the present invention, a diode is broadly interpreted as any two-terminal device whose resistance at the read voltage is substantially lower than when the applied voltage has a magnitude smaller than or polarity opposite to that of the read voltage. It is also referred to as quasi-conduction layer in Zhang (U.S. Pat. No. 5,835,396). In one exemplary embodiment, the diode is a semiconductor diode, e.g. p-i-n silicon diode, as disclosed in Crowley et al. "512 Mb PROM with 8 Layers of Antifuse/Diode Cells" (referring to 2003 International Solid-State Circuits Conference, FIG. 16.4.1). In another exemplary embodiment, the diode is a metal-oxide diode, e.g. titanium oxide, nickel oxide, as disclosed in Chevallier et al. "A 0.13um 64 Mb Multi-Layered Conductive Metal-Oxide Memory" (referring to 2010 International Solid-State Circuits Conference, FIG. 14.3.1). Although the metal oxide layer in Chevallier has a nearly symmetric I-V characteristic (i.e. the metal oxide layer is conductive in both polarities), it is still considered as a diode because its I-V characteristic is logarithmic.

The substrate circuit 0K comprises first and second decoders 14, 24 for the first and second memory levels 10, 20, respectively. Each of the first and second decoders 14, 24 comprises a plurality of decoding devices. Decoding device is the basic building block of the decoders 14, 24. It performs at least a portion of the decoding function for the memory array. The decoding device has a conduction mode and a blocking mode: in the conduction mode, current conduction is allowed in an address-line associated with the decoding device; in the blocking mode, current conduction is blocked in this address-line. Most common decoding devices are transistors or transistor-like devices, which have three or more terminals. In a parent application of the present application (i.e. application Ser. No. 14/636,346), the decoding devices are also referred to as switching devices.

As is well known in the art, the manufacturing process of a diode is much simpler than that of a transistor. To lower the overall manufacturing cost of a conventional 3D-M, only memory devices (i.e. diodes or diode-like devices), but no decoding devices (i.e. transistors or transistor-like devices), are formed in each memory level 10. Because no decoding is performed in any memory levels 10, 20 (i.e. all decodings are performed in the substrate circuit 0K), each address-line 11a has to have its own contact via 13a to the substrate circuit 0K. In other words, the contact via 13a cannot be shared between address-lines. As a result, the contact vias (e.g. 13a, 13c) at most have a pitch $p_c$ twice as large as the x-line pitch p, i.e. $p_c=2p$ (FIG. 1C). This happens when the contact vias (e.g. 13a, 13c) are interleaved, i.e. the x-lines (e.g. 11a, 11c) have their contact vias (e.g. 13a, 13c) formed to their right end (+x direction), while their immediately neighboring x-lines (e.g. 11b, 11d) have their contact vias (not shown) formed to their left end (−x direction). Hereinafter, a pitch is the center-to-center distance between two adjacent contact vias (or, two adjacent lines). In most cases, the line pitch p is twice the line width f (i.e. p=2f).

Apparently, the contact-via size $d_c$ and spacing $g_c$ could be twice the x-line width f (i.e. $d_c$=2f, $g_c$=2f) (FIG. 1D). Even so, because the line width f can be made half of the minimum lithography resolution F (i.e. f=F/2) or even smaller, the contact-via size is still the minimum lithography resolution F (i.e. $d_c$=F, $g_c$=F). Because they need a high-resolution (F-node) mask, the contact vias incur a high manufacturing cost.

In the present invention, all contact vias associated with a single memory level are collectively referred to as a contact-via set (FIG. 1E). For example, all contact vias (e.g. 13a-13z) associated with the memory level 10 form a first contact-via set 13, and all contact vias (e.g. 23a-23z) associated with the memory level 20 form a second contact-via set 23. Because each memory level has its own contact-via set (FIG. 1A), a 3D-M with a large number of memory levels needs a large number of contact-via sets. This further increases the manufacturing cost.

With a small spacing ($g_c$=2f), the contact vias (e.g. 13a, 13c, 13e) are dense contact vias. They fence the substrate circuit 0K in such a way that the interconnect of the substrate circuit 0K cannot pass through the gaps 04g between the contact vias 13a, 13c . . . (FIG. 1D). This severely limits the design flexibility of the substrate circuit 0K. Because the dense contact vias completely separate the first and second decoders 14, 24, the second decoder 24 cannot share any components with the first decoder 14 and needs to be a full decoder (FIG. 1E). This requires the x-line 21a on the memory level 20 to extend an excessive distance $L_{px}$ to reach the contact vias 23a (FIG. 1A). Long $L_{px}$ lowers the array efficiency and reduces the memory density. More details will be disclosed in the following paragraphs.

The excessive distance $L_{px}$ extended by the x-line 21a is referred to as the x-peripheral length. It is defined as the length of the x-line 21a from the last memory device tad of the memory array 200A to the edge of the x-line 21a or the contact via 23a, whichever is longer (FIG. 1A). Because the topmost memory level 20 has the longest x-line and defines the footprint of the memory block 100, $L_{px}$ only needs to be defined for the topmost memory level 20. Likewise, a y-peripheral length $L_{py}$ can be defined. For a memory array 200A containing N*N memory devices, the useful length $L_m$ of the x-line 21 a (i.e. the length used for the memory devices) is N*p, with its total length $L_t$=N*p+2$L_{px}$. Accordingly, the x-efficiency $E_x$, which is the percentage of the x-line 21a used for memory devices, can be expressed as $E_x$=$L_m$/$L_t$=$(1+2L_{px}/N/p)^{-1}$; and the array efficiency $E_A$, which is the percentage of the memory array 200A used for memory devices, is a product of $E_x$ and $E_y$ (y-efficiency), i.e. $E_A$=$E_x$*$E_y$=$(1+2L_{px}/N/p)^{-1}$ $(1+2L_{py}/N/p)^{-1}$.

To accommodate a full decoder 24 between the contact vias 13a and 23a on the substrate 0, the x-line 21a of the memory level 20 has to be extended by at least a full width $W_D$ of the decoder 24, i.e. $L_{px}$>$W_D$ (FIGS. 1A & 1E). Likewise, the y-line 22a also needs to be extended by an excessive distance. Large peripheral lengths $L_{px}$ and $L_{py}$ increase the memory-array size, lower the array efficiency and reduces the memory density.

Besides the above adverse effects, dense contact vias cast a shadow on the future of three-dimensional integrated circuit (3D-IC). In the post Moore's Law era, 3D-IC is a natural extension of the conventional two-dimensional integrated circuit (2D-IC). 3D-M is considered as a most suitable candidate for the 3D-IC because its memory levels do not occupy any substrate and its substrate can be used to form circuit components such as a processor. One possible 3D-IC is a 3D-M-based system-on-a-chip (SoC). However, as dense contact vias partition the substrate into isolated regions, the layout of the substrate circuit become difficult if not impossible.

OBJECTS AND ADVANTAGES

It is a principle object of the present invention to provide a three-dimensional memory (3D-M) with a lower manufacturing cost.

It is a further object of the present invention to improve the design flexibility of the substrate circuit of a 3D-M.

It is a further object of the present invention to facilitate the realization of a three-dimensional integrated circuit (3D-IC).

It is a further object of the present invention to facilitate the realization of a 3D-M-based system-on-a-chip (SoC).

It is a further object of the present invention to provide a 3D-M with a simpler decoder design.

It is a further object of the present invention to provide a 3D-M with a better array efficiency.

It is a further object of the present invention to provide a 3D-M with a larger memory density.

In accordance with these and other objects of the present invention, a compact 3D-M is disclosed. Its memory levels comprise simple decoding devices (or, decoding devices, e.g. pass transistors), whose formation requires minimum change to that of the memory devices.

SUMMARY OF THE INVENTION

The present invention discloses a compact three-dimensional memory (3D-$M_c$). The 3D-$M_c$ comprises at least a memory level stacked above a semiconductor substrate with transistors thereon. The memory level further comprises at least a memory array and at least an above-substrate decoding stage thereof. The memory array comprises a plurality of memory devices, with each memory device comprising a diode or a diode-like device. The memory device is generally a two-terminal device formed at the intersection of an x-line and a y-line. The above-substrate decoding stage comprises a plurality of decoding devices, with each decoding device comprising a transistor or a transistor-like device. The decoding device is generally a three-terminal device formed at the intersection of an x-line and a control-line (or, c-line, which is a special y-line for decoding). It performs at least a portion of the decoding function for the memory array. Examples include MOSFET (metal-oxide-semiconductor FET) and JFET (junction FET). The decoding device has a conduction mode and a blocking mode: in the conduction mode, the decoding device is switched on to allow current conduction in the address-line (e.g. x-line); in the blocking mode, the decoding device is switched off to block current conduction in the address-line (e.g. x-line).

Although both are formed at the intersections of two address-lines, the memory device and the decoding device have different electrical characteristics. In a memory device, both the overlap portion and the non-overlap portions of the x-line with the y-line have the same electrical characteristics: both are both highly-conductive. On the other hand, in a decoding device, the overlap portion and the non-overlap portions of the x-line with the c-line have different electrical characteristics: while the non-overlap portions are still highly-conductive, the overlap portion is semi-conductive. Hereinafter, the portion of the x-line overlapping (or, overlapped by) the y-line is referred to as the overlap portion of the x-line with the y-line; and, the portions abutting the overlap portion are referred to as the non-overlap portions of the x-line with the y-line.

The above-substrate decoding stage could be an intra-level decoding stage, an inter-level decoding stage or a combination thereof. For the intra-level decoding stage, decoding is performed for address-lines in a same memory level and therefore, a contact via can be shared by at least two address-lines in the same memory level. For the inter-level decoding stage, decoding is performed for address-lines in different memory levels and therefore, a contact via can be shared by address-lines in at least two memory levels. Sharing leads to sparse contact vias (relative to prior art), fewer contact-via sets (e.g. all eight memory levels share a single contact-via set) and a lower manufacturing cost. Furthermore, because sparse contact vias allow interconnects to pass through, decoders can be shared for different memory levels. This results in shorter peripheral lengths $L_{px}$, $L_{py}$, higher array efficiency (as high as ~95%) and a higher memory density. More importantly, sparse contact vias facilitate the integration of the 3D-M and the substrate-circuit components (e.g. a processor). This has profound effects on the realization of three-dimensional integrated circuit (3D-IC). For example, 3D-M-based system-on-a-chip (SoC) can be realized.

The decoding device is designed in such a way that its inclusion in the memory level incurs minimum change to the manufacturing process thereof. The key to forming a decoding device is to turn semi-conductive the overlap portion of the x-line with the c-line. In one preferred embodiment, the x-line comprises a heavily-doped semiconductor material, which is counter-doped to a semi-conductive material in the overlap portion thereof. In another preferred embodiment, the x-line comprises a lower semi-conductive sub-layer and an upper highly-conductive sub-layer. Within the overlap portion, the upper highly-conductive sub-layer is removed and only the lower semi-conductive sub-layer remains. In yet another preferred embodiment, the x-line comprises a metallic material, which is replaced by a semi-conductive material in the overlap portion thereof.

BRIEF DESCRIPTION OF THE DRAWINGS

FIG. 2C is a side view of the first preferred 3D-$M_c$; FIG. 2E is a cross-sectional view of FIG. 2D along the cut-line BB';

Figure 1A:
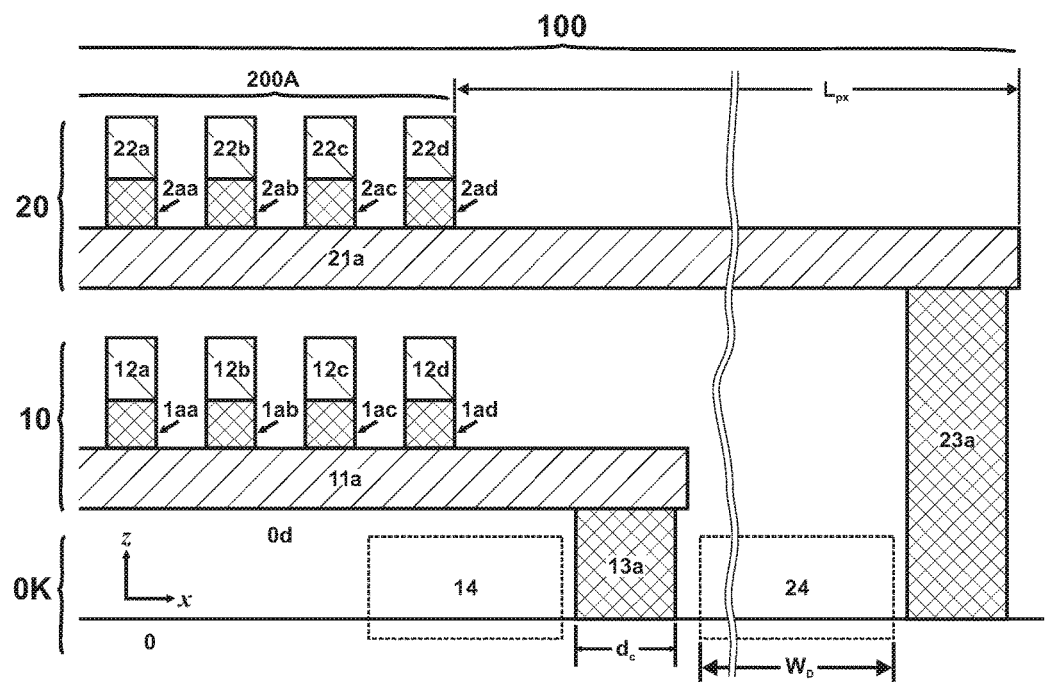
FIG. 1A is a cross-sectional view of a prior-art three-dimensional memory (3D-M)
Figure 1B:
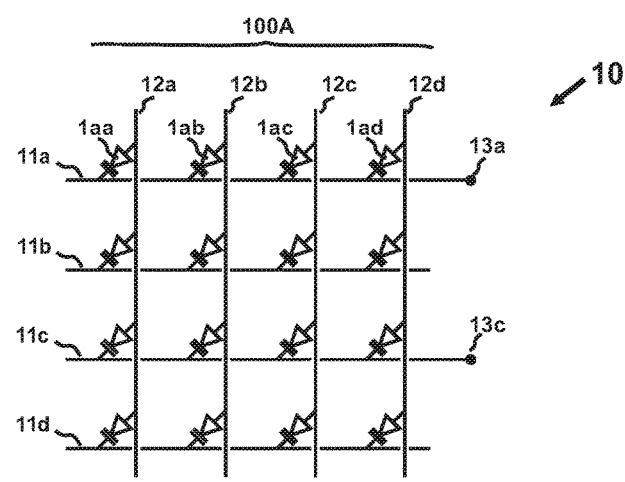
FIG. 1B is a circuit schematic for the memory level 10.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The directions of x (e.g. in the x-line) and y (e.g. in the y-line) are relative. They only mean that these address-lines (i.e. x-line, y-line) have different orientations. The symbol "/" means a relation of "and" and "or". For example, "a top/gate electrode 120/170" means a top electrode 120 and a gate electrode 170; or, a top electrode 120 or a gate electrode 170.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 12:
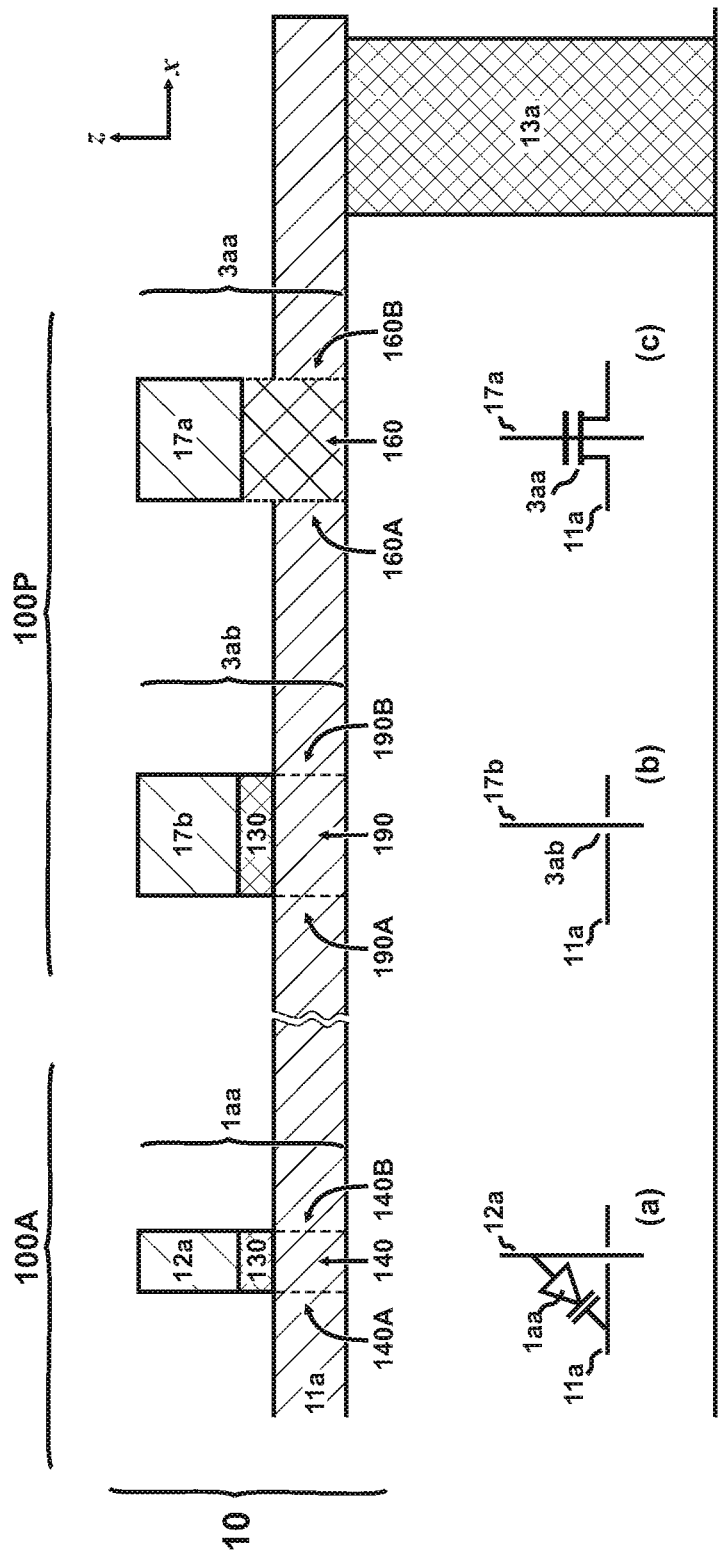
FIG. 12 is a cross-sectional view of a memory level comprising a memory device, a null device and a decoding device.

Referring first to FIG. 12, a memory level 10 with a memory device 1aa, a decoding device 3aa and a null device 3ab is disclosed. The memory level 10 is stacked above a semiconductor substrate 0 with transistors thereon. It is coupled with the substrate 0 by at least a contact via 13a. The memory level 10 further comprises at least a memory array 100A and at least an above-substrate decoding stage 100P thereof. The memory array 100A comprises a plurality of x-lines 11a, a plurality of y-lines 12a and a plurality of memory devices 1aa. Each x-line 11a extends from the memory array 100A to the above-substrate decoding stage 100P. Each y-line 12a intersects a plurality of x-lines 11a. Each memory device 1aa is generally a two-terminal device formed at the intersection of an x-line 11a and a y-line 12a. It comprises a diode or a diode-like device, which is represented by symbol (a). The memory device 1aa includes a memory layer 130 comprising a programmable layer and a diode layer. The state of the programmable layer can be altered during or after manufacturing; the diode layer generally has the following I-V characteristic: its resistance at the read voltage is substantially lower than when the applied voltage has a magnitude smaller than or polarity opposite to that of the read voltage. In some embodiments, the memory layer 130 or a portion thereof is naturally formed at a junction between the x-line 11a and the y-line 12a. Accordingly, the memory device 1aa does not comprise a separate memory layer 130. Alternatively, the memory device 1aa does not comprise a separate programmable layer or a separate diode layer.

Unlike prior art where all decoding stages of the decoder for the memory array are formed in the substrate, the above-substrate decoding stage 100P is formed on the same memory level 10 as the memory array 100A. The above-substrate decoding stage 100P comprises at least a control-line (or, c-line, a special y-line for decoding) 17a and at least a decoding device 3aa. Each c-line 17a intersects a plurality of x-lines 11a. Each decoding device 3aa is generally a three-terminal device formed at the intersection of an x-line 11a and a c-line 17a. It comprises a transistor or a transistor-like device, which is represented by symbol (c). Positioned between the memory device 1aa and the contact via 13a, the decoding device 3aa performs at least a portion of the decoding function for the memory array 100A. Examples include MOSFET (metal-oxide-semiconductor FET) and JFET (junction FET). The decoding device 3aa has a conduction mode and a blocking mode: in the conduction mode, the decoding device 3aa is switched on and the x-line 11a is electrically coupled with the contact via 13a; in the blocking mode, the decoding device 3aa is switched off and the x-line 11a is electrically isolated from the contact via 13a.

Although both are formed at the intersections of two address-lines, the memory device 1aa and the decoding device 3aa have different electrical characteristics. In the memory device 1aa, the overlap portion 140 and the non-overlap portions 140A, 1408 of the x-line 11a with the y-line 12a have the same electrical characteristics: both are highly-conductive, because they comprise the same materials and have the same structures. On the other hand, in the decoding device 3aa, the overlap portion 160 and the non-overlap portions 160A, 1608 of the x-line 11a with the c-line 17a have different electrical characteristics: while the non-overlap portions 160A, 1608 are still highly-conductive, the overlap portion 160 is semi-conductive, because they have different structures or comprise different materials. Hereinafter, the portion of the x-line 11a overlapping (or, overlapped) by the y-line 12a (or, the c-line 17a) is referred to as the overlap portion 140 (or, 160) of the x-line 11a with the y-line 12a (or, the c-line 17a); and, the portions abutting the overlap portion 140 (or, 160) are referred to as the non-overlap portions 140A, 1408 (or, 160A, 1608) of the x-line 11a with the y-line 12a (or, the c-line 17a).

In the above-substrate decoding stage 100P, besides a decoding device 3aa formed at the intersection of the x-line 11a and a first c-line 17a, a null device 3ab is formed at the intersection of the x-line 11a and a second c-line 17b. Different from the decoding device 3aa, the overlap portion 190 and the non-overlap portions 190A, 190B of the null device 3ab have the same electrical characteristics: both are high-conductive, just like the memory device 1aa. However, the operation of the null device 3ab is different from the memory device 1aa: the null device 3ab is generally reverse-biased (or, un-biased) by the voltage on the c-line 17b. As a result, the null device 3ab only allows current conduction in the x-line 11a while isolating the x-line 11a from the c-line 17b. Other than that, the null device 3ab has no function, which is represented by symbol (b).

Figure 2A:
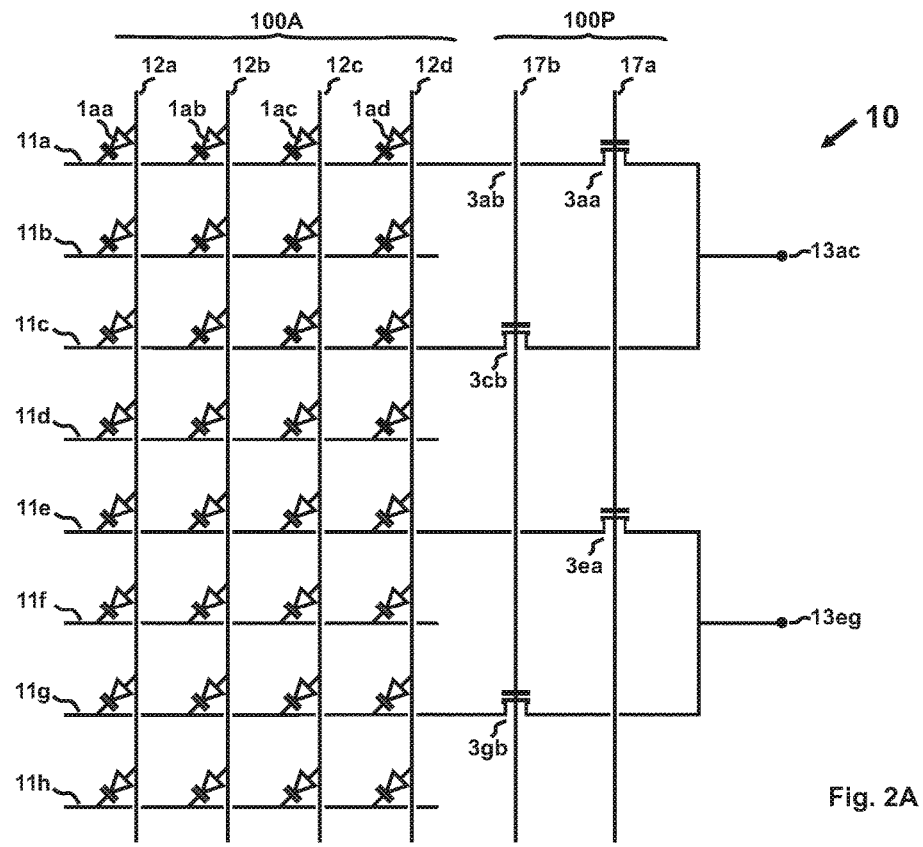
FIG. 2A is a circuit schematic for the memory level 10 of a first preferred compact three-dimensional memory (3D-$M_c$), including an intra-level decoding stage.
Figure 2B:
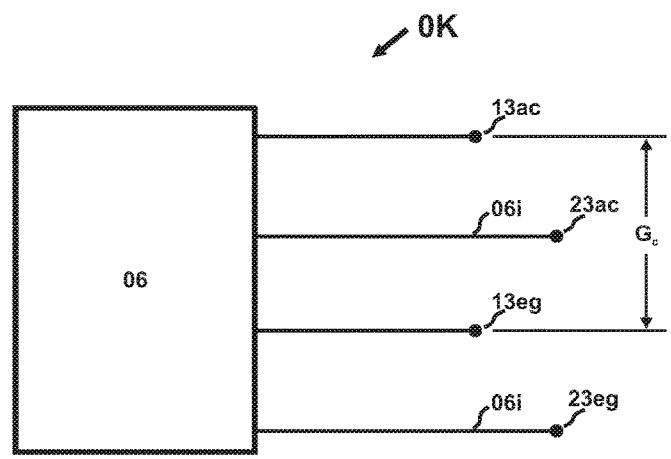
FIG. 2B is a block diagram of the substrate circuit 0K including an inter-level decoding stage 06a for memory levels 10, 20.
Figure 2D:
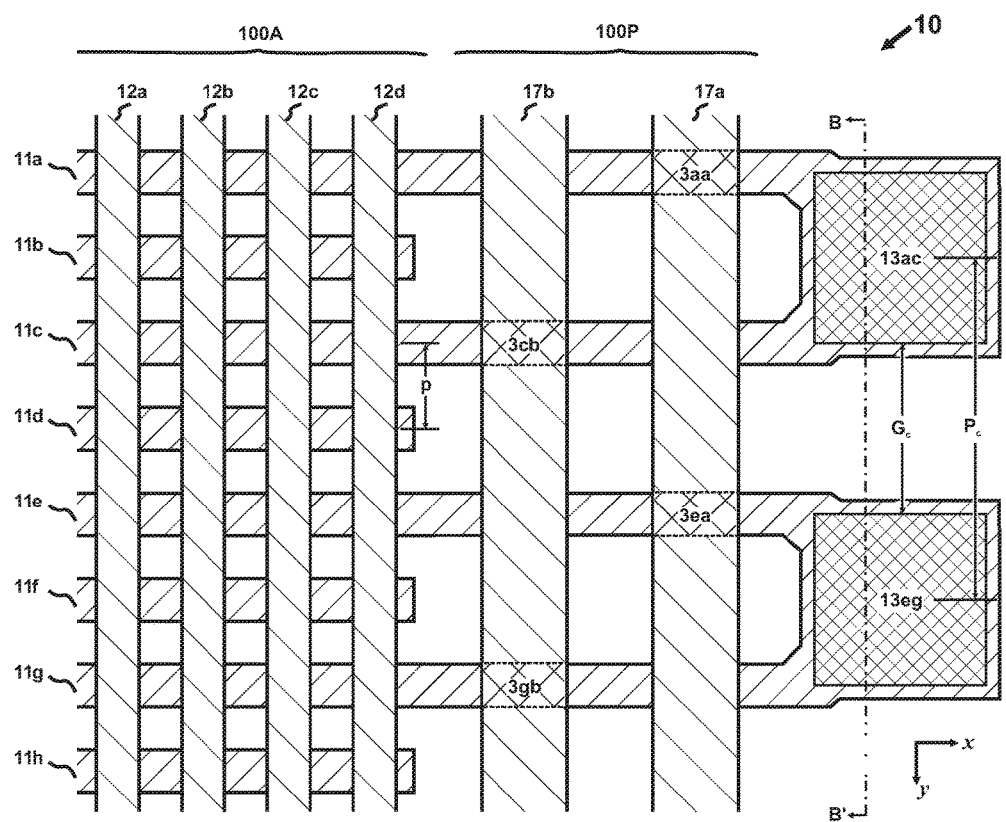
FIG. 2D is a top view of the memory level 10.

Referring now to FIGS. 2A-2E, a first preferred compact three-dimensional memory (3D-$M_c$), including an intra-level decoding stage, is disclosed. It comprises two memory levels 10, 20 stacked above a substrate 0 (FIG. 2C). The memory level 10 comprises a memory array 100A and an intra-level decoding stage 100P (referring to FIG. 2A for a circuit schematic and FIG. 2D for a top view). The memory array 100A comprises a plurality of x-lines 11a-11h . . . , y-lines 12a-12d . . . , and memory devices 1aa-1ad . . . (FIG. 2A). Extending from the memory array 100A to the inter-level decoding stage 100P, the x-lines are grouped into pairs with each pair sharing a same contact via, i.e. both x-lines in the same x-line pair are coupled to the same contact via (FIGS. 2A & 2D). For example, a first x-line pair of the x-lines 11a, 11c share a first contact via 13ac, while a second x-line pair of the x-lines 11e, 11g share a second contact via 13eg.

The intra-level decoding stage 100P selects one signal from at least two address-lines in a same memory level 10. In this preferred embodiment, the intra-level decoding stage 100P comprises two c-lines 17a, 17b. A first decoding device 3aa is formed at the intersection of the x-line 11a and the c-line 17a, and a second decoding device 3cb is formed at the intersection of the x-line 13 and the c-line 17b. Note that a null device 3ab is formed at the intersection of the x-line 11a and the c-line 17b. The contact via 13ac is selectively coupled to either the x-line 11a or the x-line 11c based on the voltage on the c-lines 17a, 17b. When the voltage on the c-line 17a switches on the first decoding device 3aa and the voltage on the c-line 17b switches off the second decoding device 3cb, the contact via 13ac is electrically coupled to the x-line 11a. On the other hand, when the voltage on the c-line 17a switches off the first decoding device 3aa and the voltage on the c-line 17b switches on the second decoding device 3cb, the contact via 13ac is electrically coupled to the x-line 11c. Sharing effectively doubles the size $D_c$ and spacing $G_c$ of the contact vias (i.e. $D_c=4f=2p$, $G_c=4F=2p$) (FIG. 2D), thus lowers their manufacturing cost.

Figure 1C:
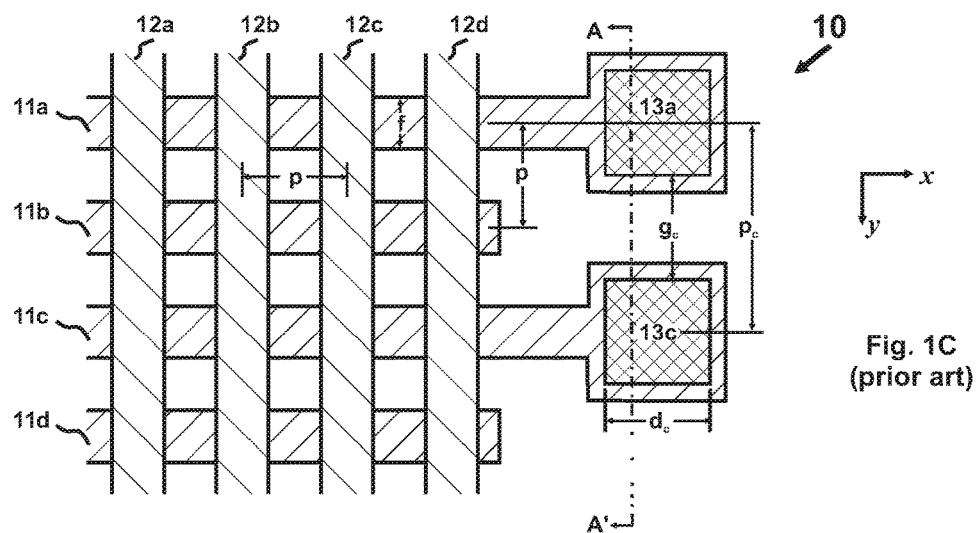
FIG. 1C is a top view of the memory level 10.
Figure 1D:
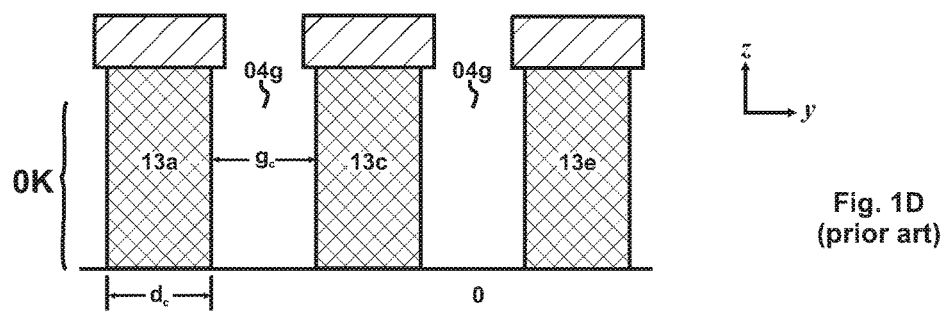
FIG. 1D is a cross-sectional view of FIG. 1C along the cut-line AA'.
Figure 1E:
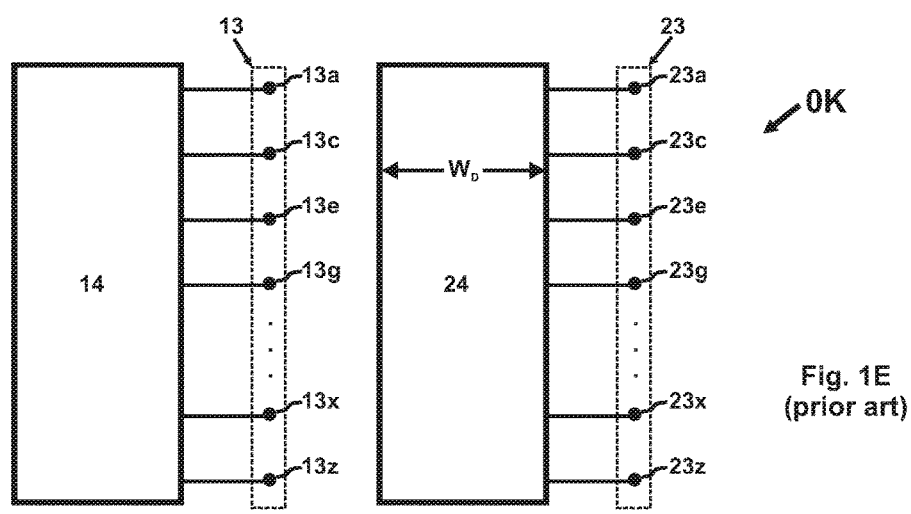
FIG. 1E is a block diagram of the substrate circuit 0K including decoders 14, 24 for memory levels 10, 20.

The substrate circuit 0K comprises a common decoder 06 for the memory levels 10, 20 (FIG. 2B). It is coupled with the contact vias 13ac, 13eg of the memory level 10 and the contact vias 23ac, 23eg of the memory level 20. Note that the interconnect 06i that couples the contact via 23ac (or 23eg) of the memory level 20 to the common decoder 06 has to pass through the gap 06G between the contact vias 13ac, 13eg of the memory level 10 (FIGS. 2B & 2E). In prior art, because the gap $g_c$ (=1 p) between the contact vias 13a, 13c is too small to form the common decoder 06, each memory levels (e.g. 10) has to use its own decoder (e.g. 14) (FIGS. 1C & 1E). With a large contact-via spacing $G_c$ (=2p), the interconnect 06i coupling the contact via 23ac of the memory level 20 with the common decoder 06 can pass through the gap 06G between the contact vias 13ac, 13eg of the memory level 10 (FIG. 2E). Thus, a substantial portion of the decoder 24 for the memory level 20 can be moved to the other side of the contact-via set 13 and shared with the decoder 14 for the memory level 10. Compared with that of FIG. 1A, the x-peripheral length $L_{px}$ is considerably shorter (FIG. 2C). Consequently, the memory block 100 has a higher array efficiency.

Figure 3A:
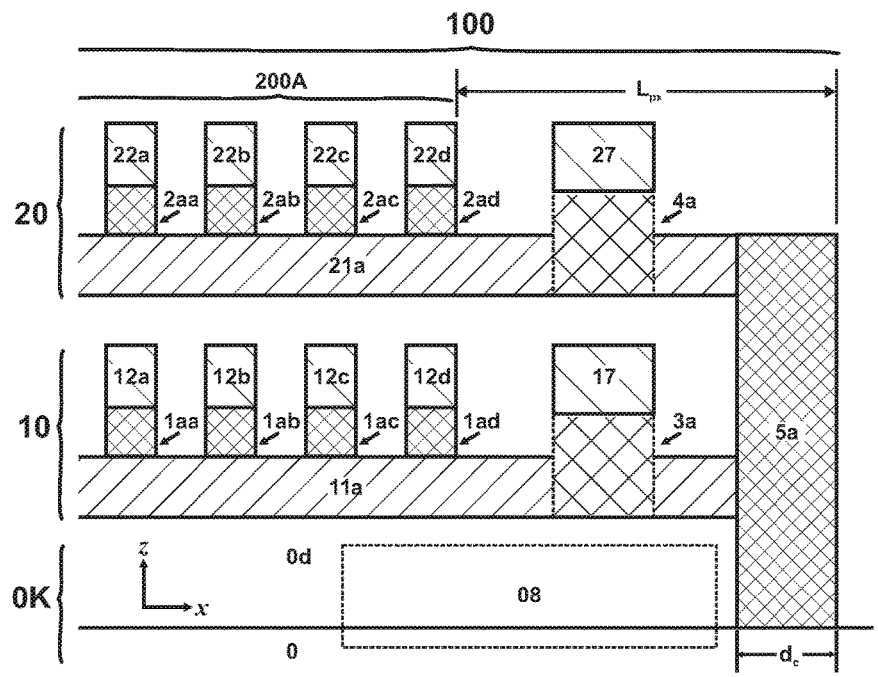
FIG. 3A is a cross-sectional view of a second preferred 3D-$M_c$, including an inter-level decoding stage.
Figure 3B:
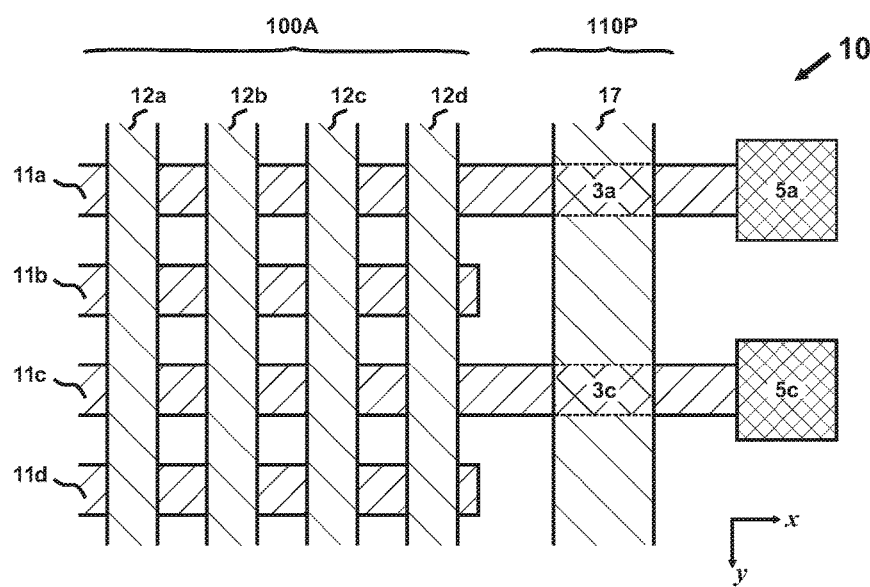
FIG. 3B is a top view of the memory level 10.
Figure 3C:
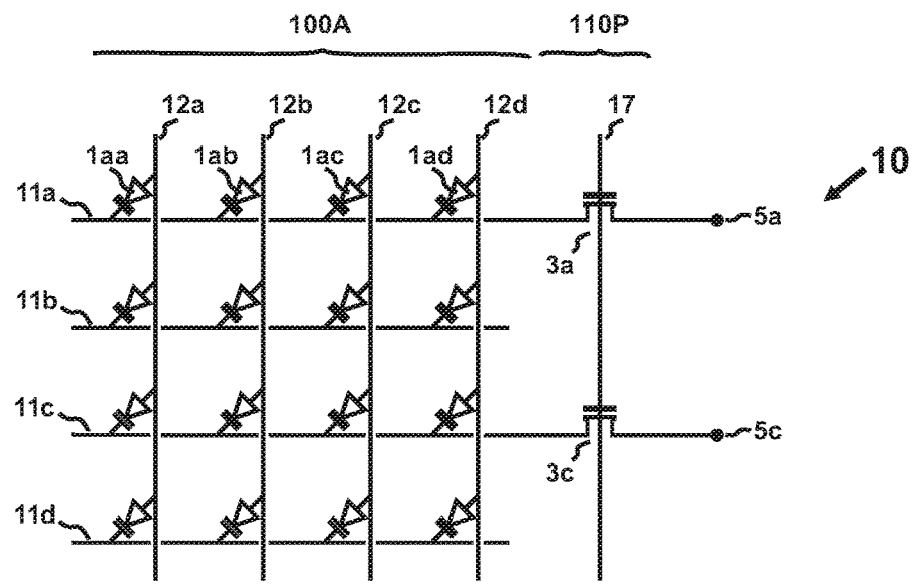
FIG. 3C is a circuit schematic for the memory level 10.
Figure 3D:
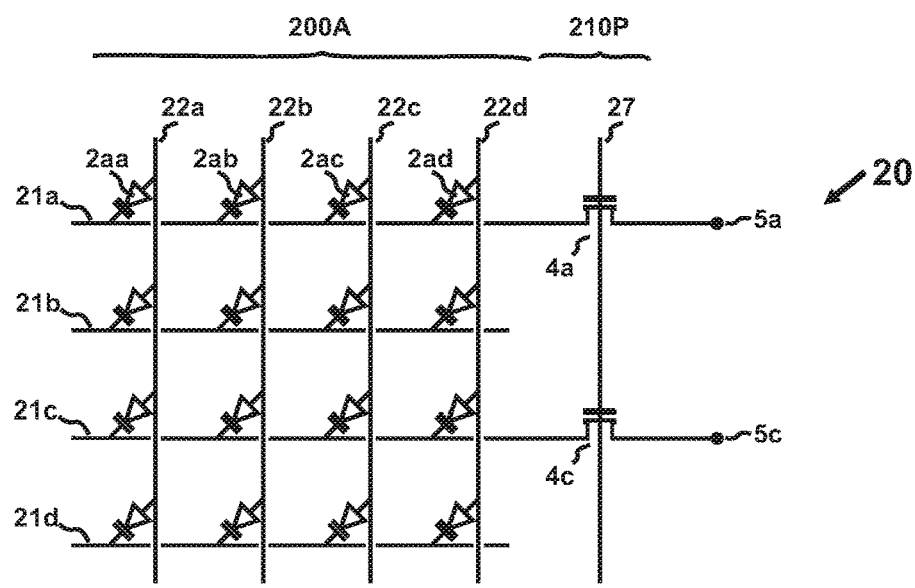
FIG. 3D is a circuit schematic for the memory level 20.

Referring now to FIGS. 3A-3D, a second preferred 3D-$M_c$, including an inter-level decoding stage, is disclosed. It comprises two memory levels 10, 20 stacked above a substrate 0 (FIG. 3A). The memory level 10 comprises a memory array 100A and a first portion 110P of the inter-level decoding stage (FIGS. 3B & 3C). The memory array 100A comprises a plurality of x-lines 11a-11d . . . , y-lines 12a-12d . . . , and memory devices 1aa-1ad . . . , with each x-line 11a extending from the memory array 100A to the first portion 110P of the inter-level decoding stage. The memory level 20 is stacked above the memory level 10. It comprises a memory array 200A and a second portion 210P of the inter-level decoding stage (FIG. 3D). The memory array 200A comprises a plurality of x-lines 21a-21d . . . , y-lines 22a-22d . . . , and memory devices 2aa-2ad . . . , with each x-line 21a extending from the memory array 200A to the second portion 210P of the inter-level decoding stage. The memory levels 10, 20 share a same contact-via set. To be more specific, the x-lines from two memory levels 10, 20 are grouped into pairs with each pair sharing a same contact via, i.e. both x-lines in a same x-line pair are coupled to the same contact via (FIG. 3A). For example, a first x-line pair of the x-lines 11a, 21a share a first contact via 5a, while a second x-line pair of the x-lines 11c, 21c share a second contact via 5c (FIGS. 3C & 3D).

The inter-level decoding stage selects one signal from address-lines in at least two memory levels 10, 20. In this preferred embodiment, the first portion 110P of the inter-level decoding stage comprises a first c-line 17, with a first decoding device 3a formed at the intersection of the first c-line 17 and the x-line 11a. The second portion 210P of the inter-level decoding stage comprises a second c-line 27, with a second decoding device 4a formed at the intersection of the second c-line 27 and the x-line 21a. The contact via 5a is selectively coupled to either the x-line 11a or the x-line 21a based on the voltage on the c-lines 17, 27. When the voltage on the c-line 17 switches on the first decoding device 3a and the voltage on the c-line 27 switches off the second decoding device 4a, the contact via 5a is electrically coupled to the x-line 11a of the memory level 10. On the other hand, when the voltage on the c-line 17 switches off the first decoding device 3a and the voltage on the c-line 27 switches on the second decoding device 4a, the contact via 5a is electrically coupled to the x-line 21a of the memory level 20. The memory levels 10, 20 share a common decoder 08 in the substrate circuit 0K. Because the x-peripheral length $L_{px}$ of FIG. 3A is considerably shorter than that of FIG. 1A, the memory block 100 has a higher array efficiency.

Sharing the contact vias among memory levels can greatly simplify the manufacturing process of the 3D-$M_C$. In prior art (FIG. 1A), as each memory level has separate contact vias, a large number of contact-via sets need to be manufactured. In the preferred embodiment of FIGS. 3A-3D, all memory levels (e.g. eight memory levels) share a single contact-via set. This contact-via set can be formed at once after all memory levels (e.g. 10, 20) are formed. To be more specific, after the formation of all memory levels (e.g. 10, 20), contact holes are etched in a single step to abut the ends of the x-lines (e.g. 11a, 21a) in all memory levels. By filling this contact hole with conductive materials, contacts with x-lines in all memory levels can be realized simultaneously.

Figure 4A:
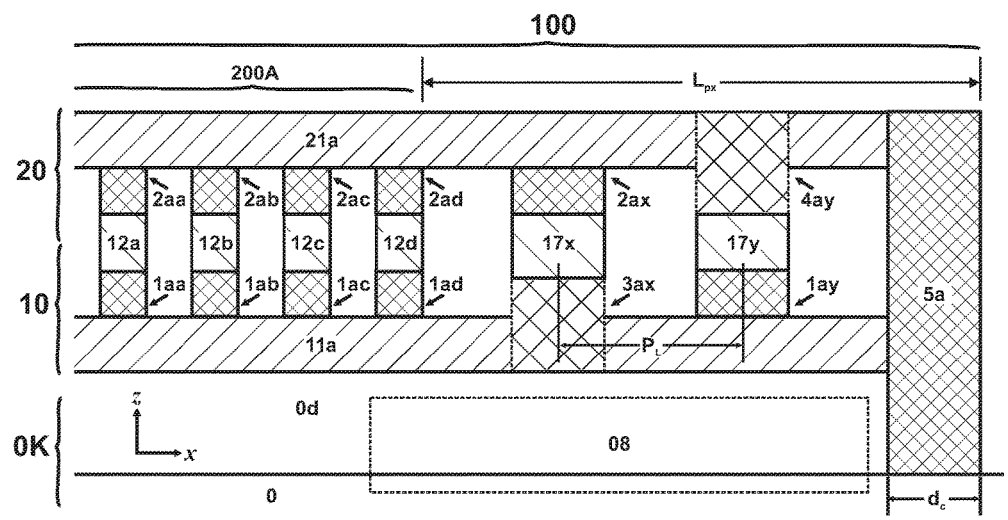
FIG. 4A is cross-sectional view of a third preferred 3D-$M_c$, including a shared above-substrate decoding stage.
Figure 4B:
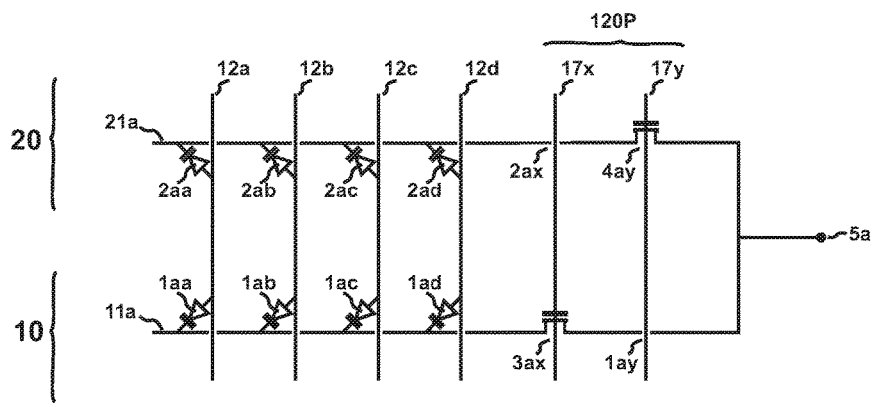
FIG. 4B is a circuit schematic for the memory levels 10, 20.

Referring now to FIGS. 4A-4B, a third preferred 3D-$M_C$, including a shared above-substrate decoding stage, is disclosed. It comprises two interleaved memory levels 10, 20 stacked above a substrate 0 (FIG. 4A), where the memory levels 10, 20 share the y-lines 12a-12d . . . The memory level 10 comprises a first plurality of memory devices 1aa-1ad . . . ; and, the memory level 20 comprises a second plurality of memory devices 2aa-2ad . . . (FIG. 4B). A shared above-substrate decoding stage 120P is formed between the memory levels 10 and 20. It functions as both intra-level and inter-level decoding stages. The decoding stage 120P comprises two c-lines 17x, 17y. A first decoding device 3ax is formed at the intersection of the x-line 11a and the c-line 17x, while a second decoding device 4ay is formed at the intersection of the x-line 21a and the c-line 17y. The contact via 5a is selectively coupled to either the x-line 11a of the memory level 10 or the x-line 21a of the memory level 20 based on the voltage on the c-lines 17x, 17y. When the voltage on the c-line 17x turns on the decoding device 3ax while the voltage on the c-line 17y turns off the decoding device 4ay, the contact via 5a is coupled to the x-line 11a. On the other hand, when the voltage on the c-line 17x turns off the decoding device 3ax while the voltage on the c-line 17y turns on the decoding device 4ay, the contact via 5a is coupled to the x-line 21a.

Combining the techniques of FIGS. 2A-4B, a 3D-$M_C$ with an extremely high array efficiency can be designed. Take a 3D-$M_C$ with eight interleaved memory levels (comprising five x-line levels and four y-line levels) as an example. Along the +x-direction, it has seven c-lines, including two c-lines for an intra-level decoding stage and five c-lines for an inter-level decoding stage controlling five x-line levels. Each contact via is shared by a total of ten x-lines, including two x-lines in each of five x-line levels. Thus, the x-peripheral length $L_{px}=7P_L+P_c=18p$, where $P_L$ is the pitch of c-lines ($P_L=2p$, as in FIG. 4A) and $P_c$ is the pitch of contact via ($P_c=4p$, as in FIG. 2D). Assuming the array size is 1000*1000 memory devices (i.e. N=1000), the x-efficiency $E_x=(1+2*18p/1000p)^{-1}\approx96.4\%$. Along the +y-direction, it has two c-lines for an intra-level decoding stage. The y-peripheral length $L_{py}=2\ P_L+P_c=8p$ and the y-efficiency $E_y=(1+2*8p/1000/p)^{-1}\approx98.4\%$. Overall, the array efficiency $E_A=E_x*E_y\approx95\%$.

In a preferred 3D-$M_C$, a decoding device comprises a MOSFET. Accordingly, the x-line needs to be re-designed. In the preferred embodiments of FIGS. 5-6B, the x-line comprises a highly-conductive, heavily-doped semiconductor material, which is counter-doped to a semi-conductive material in the overlap portion thereof. In the preferred embodiments of FIGS. 7-8D, the x-line comprises a lower semi-conductive sub-layer and an upper highly-conductive sub-layer. Within the overlap portion of the x-line, the upper highly-conductive sub-layer is removed and only the lower semi-conductive sub-layer remains. In the preferred embodiments of FIGS. 9-10C, the x-line comprises a metallic material, which is replaced by a semi-conductive material in the overlap portion thereof.

Figure 5:
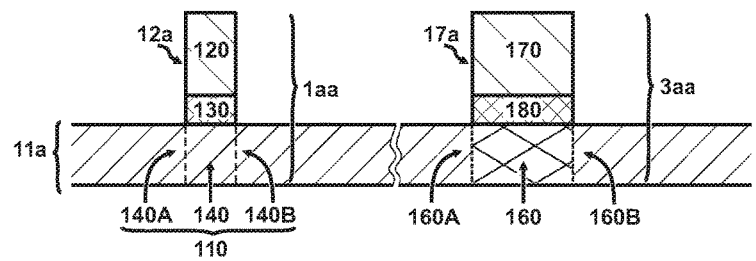
FIG. 5 is a cross-sectional view of a first preferred MOSFET-type decoding device along with a memory device.

Referring now to FIG. 5, a first preferred MOSFET-type decoding device 3aa along with a memory device 1aa is disclosed. The memory device 1aa is formed at the intersection of the x-line 11a and the y-line 12a. It comprises a top electrode 120, a memory layer 130 and a bottom electrode 110. The top electrode 120 is a portion of the y-line 12a. The bottom electrode 110 is a portion of the x-line 11a. It is highly-conductive. In this preferred embodiment, the bottom electrode 110 comprises a heavily-doped semiconductor material. The decoding device 3aa is formed at the intersection of the x-line 11a and the c-line 17a. It comprises a gate electrode 170, a middle layer 180, a modulation layer 160 and source/drain electrodes 160A, 160B. The gate electrode 170 is same as the top electrode 120 of the memory device 1aa. It is a portion of the c-line 17a. The middle layer 180 insulates the gate electrode 170 from the modulation layer 160. The modulation layer 160 is the overlap portion of the x-line 11a with the c-line 17a. It is semi-conductive and its conductivity can be modulated by the voltage on the c-line 17a. The source/drain electrodes 160A, 160B are the non-overlap portions of the x-line 11a with the c-line 17a. They are highly-conductive.

In this preferred embodiment, the overlap portion 160 of the x-line 11a with the c-line 17a is counter-doped in such a way that the modulation layer 160 becomes semi-conductive. For example, the x-line 11a (i.e. the bottom electrode 110 of the memory device 1aa) is heavily n-type doped;

whereas the modulation layer 160 is counter-doped to lightly n-type. Accordingly, the decoding device 3aa is a depletion-mode MOSFET. When no voltage is applied to the c-line 17a, the modulation layer 160 is conductive and the current conduction is allowed in the x-line 11a. When a large enough negative voltage is applied to the c-line 17a, the modulation layer 160 will become so depleted that the current conduction is blocked in the x-line 11a. Alternatively, the decoding device 3aa may be an enhancement-mode MOSFET.

Figure 6A:
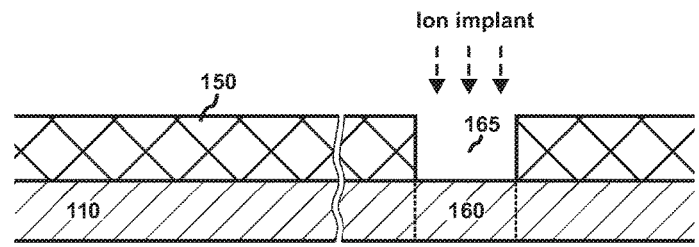
FIGS. 6A-6B illustrate two preferred methods to manufacture the first preferred MOSFET-type decoding device.
Figure 6B:
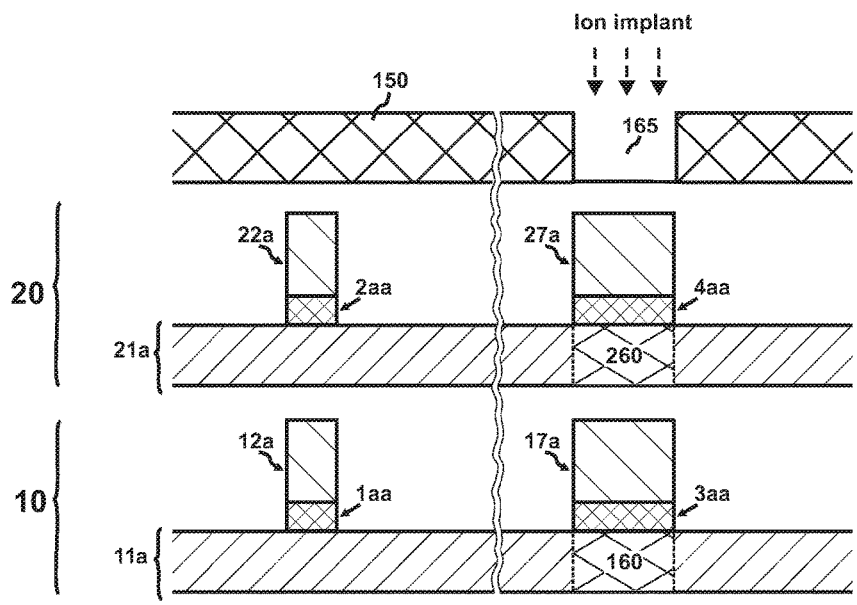

FIGS. 6A-6B illustrate two preferred methods to manufacture the first preferred MOSFET-type decoding device 3aa. In the preferred method of FIG. 6A, after the formation of a bottom electrode 110 comprising a heavily-doped semiconductor material, a photo-resist layer 150 is applied. A hole 165 is formed therein at the location of the decoding device 3aa, but no hole is formed at the location of the memory device 1aa. An ion-implant step is performed to counter-dope the heavily-doped semiconductor material under the hole 165 is counter-doped to a lightly doped semiconductor material 160, while the heavily-doped semiconductor material in other areas (i.e. not under the hole 165) remains heavily doped. After removing the photo-resist layer 150, the memory/middle layer 130/180 is formed on top of the bottom electrode 110. The memory/middle layer 130/180 and the bottom electrode 110 are etched to define the x-lines 11a. Afterwards, a high-conductive material 120 is deposited on the memory/middle layer 130/180 and then etched to define the y-lines 12a and the c-line 17a. In this preferred embodiment, a counter-doping step is performed for each memory level. To lower the manufacturing cost, the counter-doping step can be performed after all memory levels 10, 20 have been formed. In the preferred method of FIG. 6B, the modulation layers 160, 260 belonging to two memory levels 10, 20 are formed in a single counter-doping step.

Figure 7:
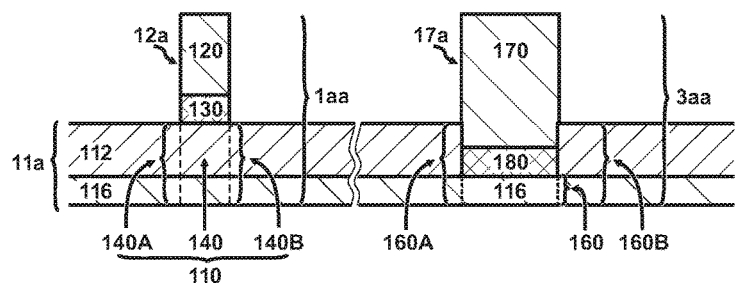
FIG. 7 is a cross-sectional view of a second preferred MOSFET-type decoding device along with a memory device.

Referring now to FIG. 7, a second preferred MOSFET-type decoding device 3aa along with a memory device 1aa is disclosed. Similar to FIG. 5, the memory device 1aa comprises a top electrode 120, a memory layer 130 and a bottom electrode 110, while the decoding device 3aa comprises a gate electrode 170, a middle layer 180, a modulation layer 160 and source/drain electrodes 160A, 160B. Different from FIG. 5, the bottom electrode 110 of the memory device 3aa comprises a lower semi-conductive sub-layer 116 and an upper highly-conductive sub-layer 112. However, the modulation layer 160 of the decoding device 3aa comprises only the lower semi-conductive sub-layer 116. In this preferred embodiment, the decoding device 3aa is a depletion-mode MOSFET. When no voltage is applied to the c-line 17a, the modulation layer 160 is conductive and the current conduction is allowed in the x-line 11a. When a large enough negative voltage is applied to the c-line 17a, the modulation layer 160 will become so depleted that the current conduction is blocked in the x-line 11a. Alternatively, the decoding device 3aa may be an enhancement-mode MOSFET.

Figure 8A:
FIGS. 8A-8D illustrate four preferred steps to manufacture the second preferred MOSFET-type decoding device.
Figure 8B:
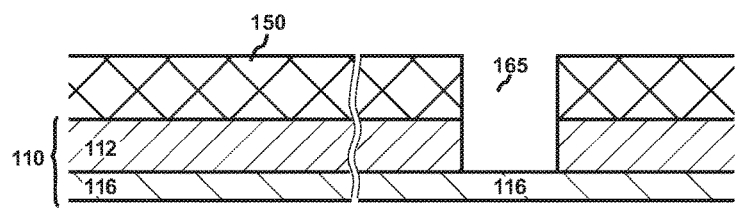
Figure 8C:
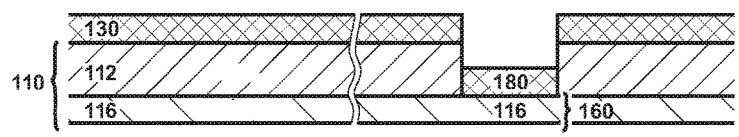
Figure 8D:
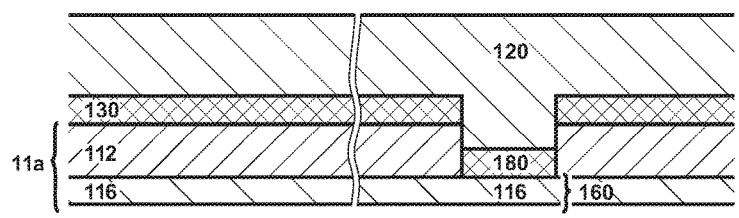

FIGS. 8A-8D illustrate four preferred steps to manufacture the second preferred MOSFET-type decoding device. A bottom electrode 110 comprising a lower semi-conductive sub-layer 116 and an upper highly-conductive sub-layer 112 is formed first (FIG. 8A). Then a photo-resist layer 150 is applied. A hole 165 is formed therein at the location of the decoding device 3aa, but no hole is formed at the location of the memory device 1aa. The upper highly-conductive sub-layer 112 under the hole 165 is etched up to the lower semi-conductive sub-layer 116, while the bottom electrode 110 in other areas (i.e. not under the hole 165) remains intact (FIG. 8B). After removing the photo-resist layer 150, the memory/middle layer 130/180 is formed on top of the bottom electrode 110. The memory/middle layer 130/180 and the bottom electrode 110 are etched to define the x-lines 11a (FIG. 8C). Afterwards, a high-conductive material 120 is deposited on the memory/middle layer 130/180 and then etched to define the y-lines 12a and the c-line 17a (FIG. 8D).

Figure 9:
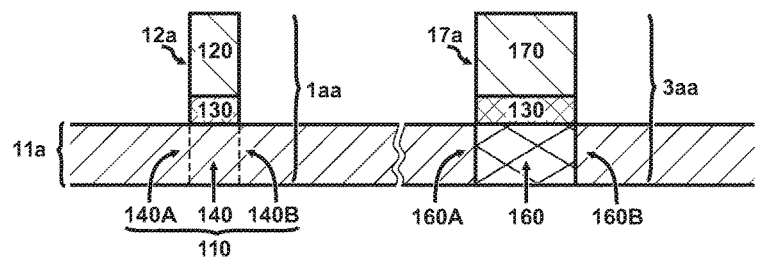
FIG. 9 is a cross-sectional view of a third preferred MOSFET-type decoding device along with a memory device.

Referring now to FIG. 9, a third preferred MOSFET-type decoding device 3aa along with a memory device 1aa is disclosed. Similar to FIG. 5, the memory device 1aa comprises a top electrode 120, a memory layer 130 and a bottom electrode 110, while the decoding device 3aa comprises a gate electrode 170, a middle layer 180, a modulation layer 160 and source/drain electrodes 160A, 160B. Different from FIG. 5, the bottom electrode 110 comprises a metallic material, while the modulation layer 160 of the decoding device 3aa comprises a semi-conductive material. In this preferred embodiment, the decoding device 3aa is a depletion-mode MOSFET. When no voltage is applied to the c-line 17a, the modulation layer 160 is conductive and the current conduction is allowed in the x-line 11a. When a large enough negative voltage is applied to the c-line 17a, the modulation layer 160 will become so depleted that it blocks the current conduction in the x-line 11a. Alternatively, the decoding device 3aa may be an enhancement-mode MOSFET.

Figure 10A:
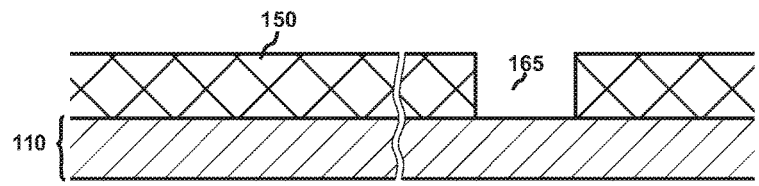
FIGS. 10A-10C illustrate three preferred steps to manufacture the third preferred MOSFET-type decoding device.
Figure 10B:
Figure 10C:
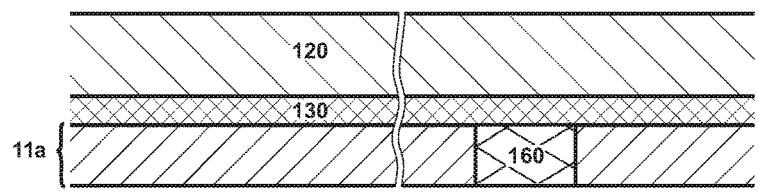

FIGS. 10A-10C illustrate three preferred steps to manufacture the third preferred MOSFET-type decoding device. After the formation of a bottom electrode 110 comprising a metallic material, a photo-resist layer 150 is applied. A hole 165 is formed therein at the location of the decoding device 3aa, but no hole is formed at the location of the memory device 1aa (FIG. 10A). The metallic material is etched under the hole 165 and a semi-conductive material 160 fills the hole 165 (FIG. 10B). This is followed by the formation of the memory/middle layer 130/180 and definition of the x-line 11a. Finally, after a highly-conductive material 120 is formed on the memory/middle layer 130/180, the y-line 12a and the c-line 17a are defined (FIG. 10C).

Figure 11A:
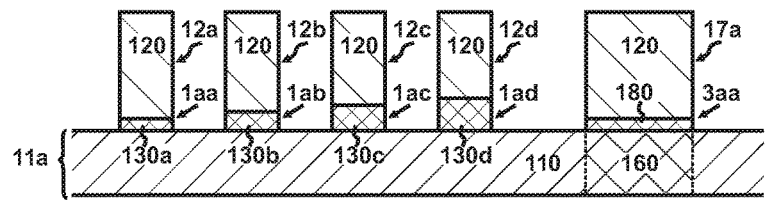
FIGS. 11A-11C are cross-sectional views of three preferred MOSFET-type decoding devices along with four 3D-MPROM devices.
Figure 11B:
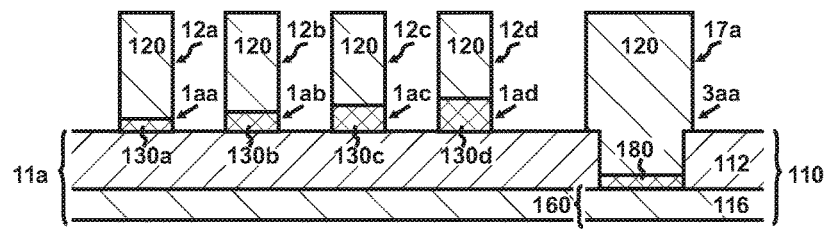
Figure 11C:
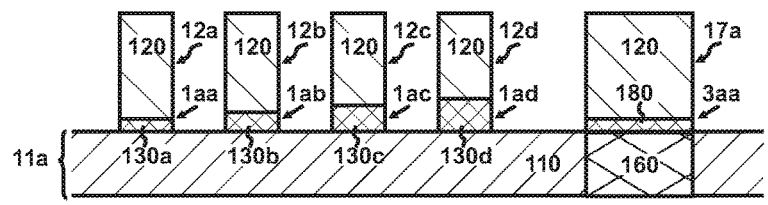

Referring now to FIGS. 11A-11C, three preferred MOSFET-type decoding devices 3aa along with four 3D-MPROM devices 12a-12d are disclosed. The decoding device 3aa in FIG. 11A is similar to that in FIG. 5; the decoding device 3aa in FIG. 11B is similar to that in FIG. 7; and the decoding device 3aa in FIG. 11C is similar to that in FIG. 9. Different from 3D-EPROM, the 3D-MPROM devices (i.e. mask-ROM cell) 12a-12d representing different digital data have different physical memory layers (e.g. the memory layers of different thicknesses). For example, in a 2-bit-per-cell 3D-MPROM, the memory device 12a representing digital "00" has the thinnest memory layer 130a; the memory device 12b representing digital "01" has the second thinnest memory layer 130b; the memory device 12c representing digital "10" has the third thinnest memory layer 130c; and the memory device 12d representing digital "11" has the thickest memory layer 130d. In order to effectively block the current conduction in the x-line 11a, the middle layer 180 in the decoding device 3aa has the same thickness as the thinnest memory layer 130a (FIGS. 11A-11C). Preferably, the thinnest memory layer 130a is used as the middle layer 180.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A compact three-dimensional mask-programmed read-only memory (3D-MPROM$_C$), comprising:
a semiconductor substrate with transistors thereon;
a memory level stacked above said semiconductor substrate, said memory level comprising at least a memory array and at least an above-substrate decoding stage thereof;
at least a contact via coupling said memory level with said semiconductor substrate;
wherein said memory array comprises:
a first address-line extending from said memory array to said above-substrate decoding stage;
a second address-line intersecting said first address-line;
a memory device located at the intersection of said first and second address-lines, said memory device comprising a memory layer between said first and second address-lines, wherein the thickness of said memory layer represents digital information stored in said memory device;
said above-substrate decoding stage comprises:
a control line intersecting said first address-line, wherein said first address-line is physically continuous in said above-substrate decoding stage;
a decoding device located at the intersection of said first address-line and said control line, said decoding device comprising a middle layer between said first address-line and said control line, wherein said decoding device has a conduction mode and a blocking mode;
wherein,
said first address-line is a conductive line except for a semi-conductive portion intersecting said control line;
the memory layers of different memory devices have different thicknesses; and
said middle layer of said decoding device has the same thickness as the thinnest memory layer.

2. The memory according to claim 1, wherein said memory device comprises a diode or a diode-like device.

3. The memory according to claim 1, wherein said memory device is a two-terminal device.

4. The memory according to claim 1, wherein said memory device is a mask-programmed read-only memory (mask-ROM) cell.

5. The memory according to claim 4, wherein said mask-ROM cell stores more than one bit.

6. The memory according to claim 1, wherein said decoding device comprises a transistor or a transistor-like device.

7. The memory according to claim 1, wherein said decoding device is a three-terminal device.

8. The memory according to claim 1, wherein said decoding device comprises a pass-transistor.

9. The memory according to claim 1, wherein said decoding device comprises a MOSFET.

10. The memory according to claim 1, wherein said decoding device is positioned between said memory device and said contact via.

11. A compact three-dimensional mask-programmed read-only memory (3D-MPROM$_C$), comprising:
a semiconductor substrate with transistors thereon;
a memory level stacked above said semiconductor substrate, said memory level comprising at least a memory array and at least an above-substrate decoding stage thereof;
at least a contact via coupling said memory level with said semiconductor substrate;
wherein said memory array comprises:
an x-line extending from said memory array to said above-substrate decoding stage;
first and second y-lines intersecting said x-line;
a first memory device located at the intersection of said x-line and said first y-line, said first memory device comprising a first memory layer between said x-line and said first y-line;
a second memory device located at the intersection of said x-line and said second y-line, said second memory device comprising a second memory layer between said x-line and said second y-line;
wherein said first memory layer is thinner than said second memory layer;
said above-substrate decoding stage comprises:
a control line (c-line) intersecting said x-line, wherein said x-line is physically continuous in said above-substrate decoding stage;
a decoding device located at the intersection of said x-line and said c-line, said decoding device comprising a middle layer between said x-line and said c-line, wherein said decoding device has a conduction mode and a blocking mode;
wherein,
said x-line is a conductive line except for a semi-conductive portion intersecting said c-line; and
said middle layer in said decoding device has the same thickness as said first memory layer.

12. The memory according to claim 11, wherein said memory device comprises a diode or a diode-like device.

13. The memory according to claim 11, wherein said memory device is a two-terminal device.

14. The memory according to claim 11, wherein said memory device is a mask-programmed read-only memory (mask-ROM) cell.

15. The memory according to claim 14, wherein said mask-ROM cell stores more than one bit.

16. The memory according to claim 11, wherein said decoding device comprises a transistor or a transistor-like device.

17. The memory according to claim 11, wherein said decoding device is a three-terminal device.

18. The memory according to claim 11, wherein said decoding device comprises a pass-transistor.

19. The memory according to claim 11, wherein said decoding device comprises a MOSFET.

20. The memory according to claim 11, wherein said decoding device is positioned between said memory device and said contact via.

* * * * *